United States Patent [19]

Jonaidi

[11] Patent Number: 5,834,705
[45] Date of Patent: Nov. 10, 1998

[54] ARRANGEMENT FOR MODIFYING ELETRICAL PRINTED CIRCUIT BOARDS

[75] Inventor: Siamak Jonaidi, San Jose, Calif.

[73] Assignee: Silicon Graphics, Inc., Mountain View, Calif.

[21] Appl. No.: 205,990

[22] Filed: Mar. 4, 1994

[51] Int. Cl.$^6$ .................................................. H05K 1/14
[52] U.S. Cl. ................... 174/261; 174/260; 174/266; 174/254; 361/792; 361/793; 439/67
[58] Field of Search ................... 174/260, 261, 174/262, 266, 251, 254, 259; 439/67, 77, 65; 361/778, 792, 793, 784, 785, 789, 790, 791, 795

[56] References Cited

U.S. PATENT DOCUMENTS

| | | | |
|---|---|---|---|
| 3,780,352 | 12/1973 | Redwanz | 361/792 |
| 4,371,744 | 2/1983 | Badet et al. | 174/68.5 |
| 4,438,561 | 3/1984 | Mueller | 29/831 |
| 4,713,494 | 12/1987 | Oikawa et al. | 174/68.5 |
| 4,731,704 | 3/1988 | Lochner | 361/400 |
| 5,081,563 | 1/1992 | Feng et al. | 361/414 |
| 5,099,393 | 3/1992 | Bentlage et al. | 361/413 |
| 5,109,320 | 4/1992 | Bourdelaise et al. | 361/785 |
| 5,136,471 | 8/1992 | Inasaka | 361/414 |
| 5,155,577 | 10/1992 | Chance et al. | 357/71 |
| 5,177,594 | 1/1993 | Chance et al. | 257/678 |
| 5,214,250 | 5/1993 | Cayson et al. | 174/250 |
| 5,220,490 | 6/1993 | Weigler et al. | 361/409 |
| 5,224,022 | 6/1993 | Weigler et al. | 361/409 |
| 5,303,119 | 4/1994 | Hillbrink | 361/749 |
| 5,350,886 | 9/1994 | Miyazaki et al. | 361/784 |
| 5,354,955 | 10/1994 | Gregor et al. | 361/785 X |
| 5,367,435 | 11/1994 | Andros et al. | 361/784 X |

*Primary Examiner*—Laura Thomas
*Attorney, Agent, or Firm*—Blakely, Sokoloff, Taylor & Zafman

[57] ABSTRACT

An apparatus for modifying a printed circuit board comprised of a nonconductively adhering flexible circuitized substrate, the flexible circuitized substrate having a conductive circuit trace composed of one or more layers of thin wires sandwiched between two or more layers of flexible insulating protective material. The wires forming the circuit trace of the flexible substrate and the conductors forming the circuitry in and on the printed circuit board are electrically interconnected at appropriate predetermined positions by establishing conductive paths through portions of the insulating layers of the flexible circuitized substrate. Circuit components can also be affixed to either the flexible circuitized substrate or to the printed circuit board or to both after the flexible circuitized substrate has been affixed to the printed circuit board. By this means, additional or corrective electrical connections can be made to the printed circuit board at one time without the danger of routing errors or unwanted transmission effects of soldered wire interconnects. Additionally, circuit components of a differing bonding-pad configuration or pitch may be conveniently substituted for those originally designed to be used within the printed circuit board circuitry.

21 Claims, 8 Drawing Sheets

ARRANGEMENT FOR MODIFYING ELETRICAL PRINTED CIRCUIT BOARDS

FIELD OF THE INVENTION

The present invention relates generally to printed wiring or circuit boards and, more particularly, to a low cost, post-fabrication arrangement for modifying or redefining the circuit pattern on an existing printed circuit board, including the modification of the electrical wiring therein, and for enabling the substitution of electrical components to be mounted thereon. In particular, there is a need to be able to increase, repair and/or reroute electrical interconnects and wiring internal to and/or on the surface of printed circuit boards whenever it is necessary to correct manufacturing defects or design oversights. Additionally, there is a recurring need in the electronics and computer systems industries to modify existing printed circuit boards to enable the upgrading of electrical components desired to be placed thereon. For example, after a printed circuit board has been manufactured, it may become desirable to substitute a higher-performance central processor unit ("CPU") for the CPU originally designed into the board's circuitry or to replace one memory device with another of a higher-capacity or higher-speed. At a minimal cost and with the expenditure of a minimal amount of engineering time, the present invention will facilitate the modification, upgrading and/or correction of printed circuit boards by allowing the system manufacturer to attach to the surface of a printed circuit board a flexible wire patch which contains customized circuit interconnects.

BACKGROUND OF THE INVENTION

It is common practice today to interconnect many passive and active circuit elements or components, on a common substrate, wherein the substrate provides for electrical interconnects among these components. These electrical interconnects typically consist of numerous individual conductive printed wire traces sandwiched between alternating ceramic or epoxy insulating layers. The wire traces of one conductive layer may be selectively brought into electrical contact with the wire traces of any other conductive layer by means of selectively positioned electrically conductive vias. The wire traces may be either deposited directly on or etched onto the surfaces of the ceramic substrate. These wire traces may be interconnected with the embedded wire traces located between the insulating layers by vias to enable the selective electrical interconnection of components that the circuit designer may affix to the surface of the substrate to form an operative electrical system or sub-system. These substrates are commonly know as "printed circuit boards" in the industry. Printed circuit boards are used in a wide range of electronic applications and, in particular, as sub-systems used in building computer systems.

The manufacturer of modern computer systems must be prepared to design and manufacture a variety of complex multilayered printed circuit boards to protect, serve as the platform for and provide electrical interconnects between the various circuit components that perform the many sub-system functions inherent in a computer's operation. As the performance of computer systems increases, so does the complexity and cost of developing and manufacturing these printed circuit boards. For example, it is not uncommon for a computer system's CPU board (the "mother board") to be comprised of six or more levels of printed wire layers containing literally thousands of individual wire traces while providing surface mounting or bonding sites for hundreds of circuit components on either one or both surfaces of the printed circuit board. Such complex printed circuit boards require considerable initial design effort, as well as debugging and redesign, before production runs can be reliably and economically undertaken.

Not infrequently, after a printed circuit board design has been released for production, circuit errors will be discovered in the layout of traces within the substrate or on the surface of the boards. Such discoveries can occur after numerous copies of the printed circuit board have already been manufactured. In such circumstances, it may become necessary to provide alternative signal pathways around unintentional open circuits or to eliminate unintentional short circuits between traces. Additionally, even if the printed circuit board has been properly designed, it may become necessary to correct for manufacturing defects that adversely affect the electrical interconnects within the printed circuit board. For example, sections of the internal trace circuitry may have been inadvertently deleted during photo-layout of the wire traces in the board. Although not due to any design or manufacturing errors or oversights, a post-manufacturing rewiring of the printed circuit board might be desirable where the rapid introduction of new, higher-performance electrical components may make it attractive to substitute these newer electrical components for those originally designed into the already manufactured printed circuit board. Furthermore, when the desired circuitry may require that the number of traces within and on the surface of a printed circuit board exceed the manufacturable trace density for such a board, the board design engineer may be required to resort to the use of external wire leads to provide additional traces.

In the past, the only feasible way to modify, update and/or salvage such boards has been to abrade or cut surface traces on the printed circuit board and, when necessary, to hand solder corrective electrical jumper wires onto the cut leads in order to reroute or replace the circuitry. These jumper wires often must travel long distances between electrical components, which components may even be located on opposite surfaces of the printed circuit board. If extensive rerouting is required, numerous jumper wires must be attached at various target locations throughout the surface of the printed circuit board. Such wires are generally of thin diameter and are therefore difficult to solder in place and are subject to easy breakage. These jumper wires may also extend a significant distance above the plane of the printed circuit board in order to straddle components, thereby comprising the signal integrity of the wires, mechanically interfering with the cooling convective airflow over the components and exposing the wires to excessive wear and the risk of being snagged during installation. With the advent of very high density printed circuit boards containing internal electrical interconnects on the order of several hundred individual traces, per inch of printed circuit board width, per interconnect layer, the use of jumper wire rerouting becomes problematical, expensive and unreliable.

An associated problem for the printed circuit board designer has been the requirement to provide system manufacturers with the ability to modify, upgrade and/or expand the capacity of their system products prior to shipment. In the past, in order to accommodate a wide range of potential systems design options, it has been necessary for sub-system designers to design the circuitry for and have manufactured numerous printed circuit boards, each with slightly differing circuit configurations. Although each such printed circuit board would perform essentially the same computer sub-system function, each variant of the board would have different wire routings or different bonding pad configurations so as to accommodate the different customer requirements. Thus, a printed circuit board that was designed to serve as a computer system's mother board might need to have as many wiring variants as the manufacturer would need to cover the spectrum of available CPUs, cache memory options and the like. Prior to the invention disclosed herein, several different printed circuit boards performing the same sub-system funcion but each having slightly different wiring or bonding pad layouts would have to be designed, manufactured, tested and inventoried to cover the spectrum of possible system configurations that might be offered to potential customers.

OBJECTS OF THE INVENTION

Broadly, this invention provides an arrangement for making modifications, repairs and engineering changes to printed circuit boards, modules and the like; more simply, more reliably, more quickly and at lower cost than heretofore possible.

Accordingly, it is an object of the present invention to provide a new and improved method and structure for modifying an inaccessible circuit network within the substrate of a printed circuit board, where such substrate provides a platform for electrical interconnects between and among a multitude of circuit components.

Another object of the present invention is to provide an engineering change technique for rerouting circuit interconnects in an already manufactured printed circuit board, wherein the printed circuit board may be modified to accommodate differing circuit components of varying geometrical bonding pad dimensional specifications or footprints and/or connector pin counts and pin spacings as compared to those components originally designed into the printed circuit board circuitry.

A further object of the present invention is to provide a technique for easily testing the correctness of rerouted electrical interconnects after a printed circuit board has been so modified.

A further object of the present invention is to provide a technique for reliably affixing the custom circuit modifying interconnect leads to a surface of a printed circuit board where the topography of the surface is non-planar and contains structural protrusions such as elevated circuit components.

SUMMARY OF THE INVENTION

Disclosed is an arrangement for reworking a printed circuit board. According to one aspect of the invention, multiple customized conductive insulated leads or wires are applied to a surface of a printed circuit board in a single operation by application of a relatively thin, insulated, flexible substrate or "wiring patch". The wires contained in the flexible wire patch provide additional or replacement electrical conductors to the printed circuit board in a predetermined, stable and established form.

The flexible wire patch is formed from a substrate comprised of alternating layers of insulating and conductive materials, wherein the wires are sandwiched between the insulating layers which layers also serve to protect and support the wires. Additionally, the insulating layers of the flexible wire patch will insure that there will be no undesired or unintentional electrical contact between the wires within the flexible wire patch or between the wires and the surface traces of the printed circuit board. At predetermined points situated on the upper and/or lower insulating surface layers of the flexible wire patch, the wires may be exposed by creating voids in the insulating layer. Voids may be created when the insulating layers are formed or by subsequently removing a portion of the insulating layer to the depth of the selected target wire. Voids so created in the surface layer of the flexible wire patch will enable electrical contact or bonding of wires with corresponding pre-selected wire traces in the surface of the printed circuit board to which the surface layer of the flexible patch is to be applied. Voids created in the opposite surface layer of the flexible wire patch will enable electrical testing of the circuit established by the wires so exposed and will enable the bonding or soldering thereto of various circuit components.

In a further aspect of the present invention, the flexible wire patch is designed to easily conform to the surface topography of the printed circuit board which is to be modified. Such conformation will facilitate a permanent adhesion to the printed circuit board and will help insure that good electrical contact is maintained between the wires contained in the flexible wire patch and the corresponding surface traces on the printed circuit board. To enable the flexible wire patch to better conform to the contours of the surface of the printed circuit board, the layers of insulation and the conductive layers of the flexible wire patch are thin and are manufactured from materials selected both for their electrical properties and for their inherent flexibility. Additionally, to insure that the flexible wire patch will conform to the contours of the printed circuit board, a number of openings or holes may be made through the substrate of the patch, which holes have been sized dimensionally to receive the unobstructed passage therethrough of circuit components as well as any raised substrate features, such as screws or bolts, which might otherwise prevent the conformance of a surface of the flexible wire patch to the surface of the printed circuit board.

Another aspect of the present invention directs that by the proper placement of holes in and through the substrate of the flexible wire patch, the connection leads of components which have been affixed to the opposite surface of the printed circuit board, may be exposed for solder application during the solder reflow stage of the manufacturing cycle. Because the lengths of the component leads to be so soldered are made to be slightly longer than the thickness of the substrate, the protruding ends of these leads will extend somewhat beyond the upper surface of the printed circuit board so as to better enable the proper soldering of such components thereto. If the holes are appropriately sized and located, the protruding ends of these connection leads will remain exposed for soldering after the flexible wire patch has been permanently affixed to the printed circuit board. These holes will also serve to facilitate the conformance of the flexible wire patch to the upper surface of the printed circuit board.

As yet another aspect of the present invention, the flexible wire patch may be used for the purpose of reducing and refining the spacing between component bonding wire traces that have been laid out on the surface of a printed circuit board. The placement of finely pitched lead traces on the surface of a printed circuit board is one of the most demanding steps in the printed circuit board manufacturing process. Yet such fine pitch lead traces are frequently required by the fine pitch lead configuration of components that must be mounted on such boards. Because the placement of fine pitched lead traces is one of the later steps in the manufacture of a printed circuit board, any yield problems encountered at this stage in the manufacturing process will result in the loss of all previous work performed on and resources invested in the manufacture of the board. According to this aspect of the present invention, the requisite fine pitched spacing between lead traces may be economically achieved though the placement of a specially designed flexible wire patch between the printed circuit board and the electrical component to be mounted thereon.

The lower surface of this specially designed flexible wire patch may contain voids that expose the terminal ends of pre-selected internal wires within the flexible wire patch. These voids may be designed to align directly with and therefor be made to be in electrical contact with the corresponding bonding lead traces on the surface of the printed circuit board. Fine pitch wires at the other terminus of each of these wires may be exposed via voids in the upper surface of the flexible wire patch so that these wires may be brought into electrical contact with corresponding fine pitch leads of the circuit component that is to be affixed to the printed circuit board. By the use of such a flexible wire patch, the surface of the printed circuit board may be allowed to contain wider pitch leads which are inturn narrowed by the specially designed flexible wire patch. Because investment in the creation of finer pitch wires is limited to the manufacture of the inexpensive flexible wire patch, any risk of loss, and the resulting costs, associated with manufacturing the entire printed circuit board can be minimized.

The flexible wire patches used for modifying printed circuit boards are preferably produced in quantity and stored at a central location and provided to individual users as needed. Since the invention removes the necessity of connecting individual wires to the printed circuit board, the modifications designed into the circuitry of the flexible patch may be carried out by less qualified personnel. At the same time, by design, all the added or rerouted conductive leads or wires will run along predetermined paths so that dependable electrical operation of the modified printed circuit board is assured.

BRIEF DESCRIPTION OF THE DRAWINGS

The present invention may be better understood and its numerous objects and advantages will become apparent to those skilled in the art by the accompanying drawings, wherein.

DETAILED DESCRIPTION OF THE PREFERRED EMBODIMENTS

Figure 1:
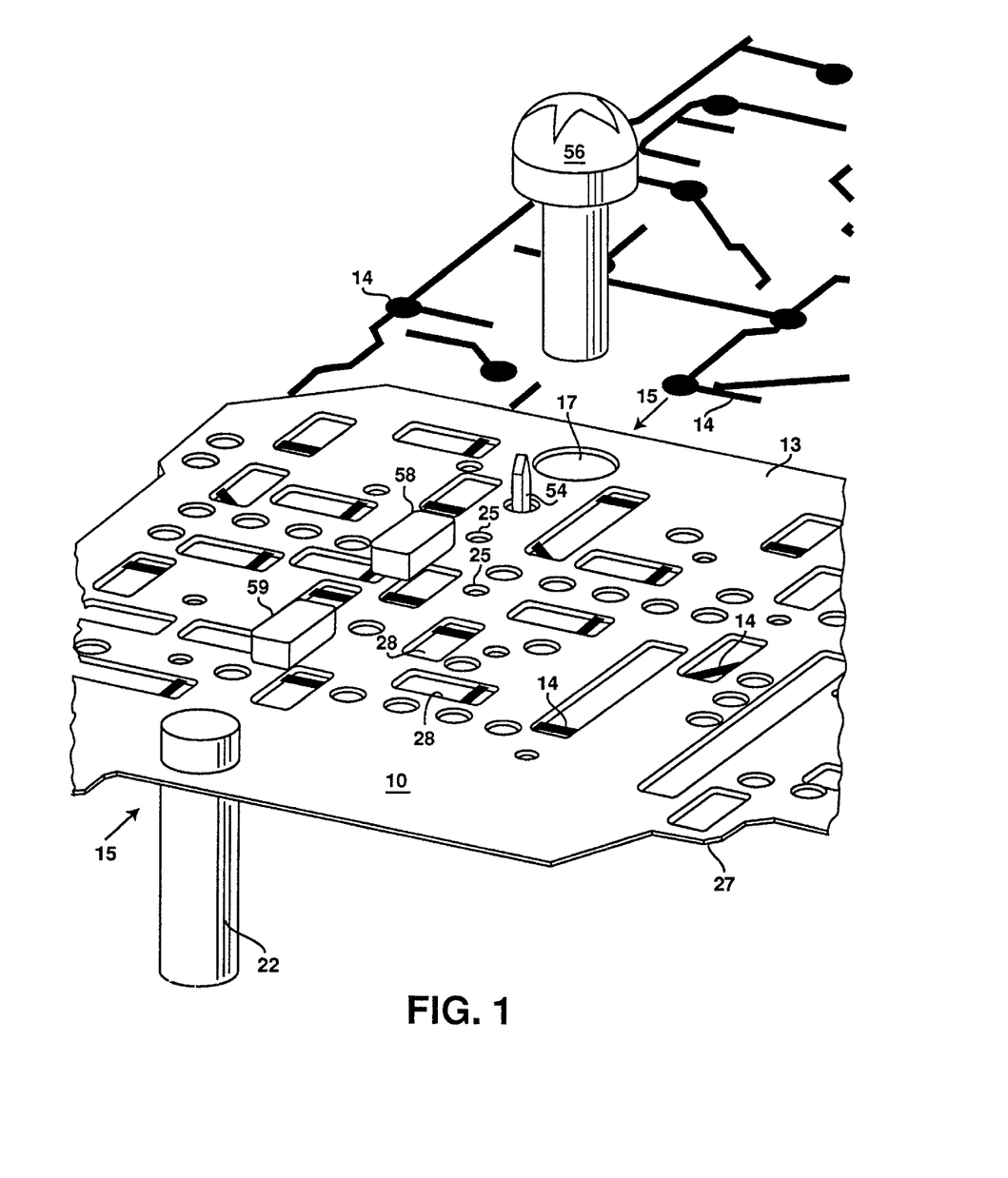
FIG. 1 is a partially-broken, perspective view of a preferred embodiment of the present invention.

Referring first to the perspective view illustrated in FIG. 1, there is shown a flexible wire patch ("FWP") circuitized substrate 10, which FWP substrate 10 has been custom designed in accordance with a preferred embodiment of the present invention. As shown in FIG. 1, the FWP substrate 10 contains a number of electrically conducting wires 14 which wires 14 form an electrical circuit. The circuit formed by the wires 14, when properly exposed for electrical contact, may be designed to correct or replace circuits within or on a printed circuit board ("PCB"), ceramic module or the like (none of which are shown in this Figure). Also illustrated in FIG. 1 are circuit components 58 and 59, that are to be mounted at a later time on the FWP substrate 10, and a circuit component lead 54 from a component (not shown) which may be mounted to the obverse side of a PCB. Also illustrated in FIG. 1 are a number of cylindrical voids 25 and rectangular voids 28 formed into and through the FWP substrate 10. These voids have been selectively dimensioned and placed so as to be brought into electrical contact with respect to the circuitry of the FWP, PCB and/or components that are to be mounted thereon, as will be explained in detail below. Also shown in FIG. 1 is an alignment dowel 22 which may serve to insure the proper alignment and affixation of the FWP substrate 10 onto the PCB, ceramic substrate or the like, in a manner to be explained in detail below.

Figure 2A:
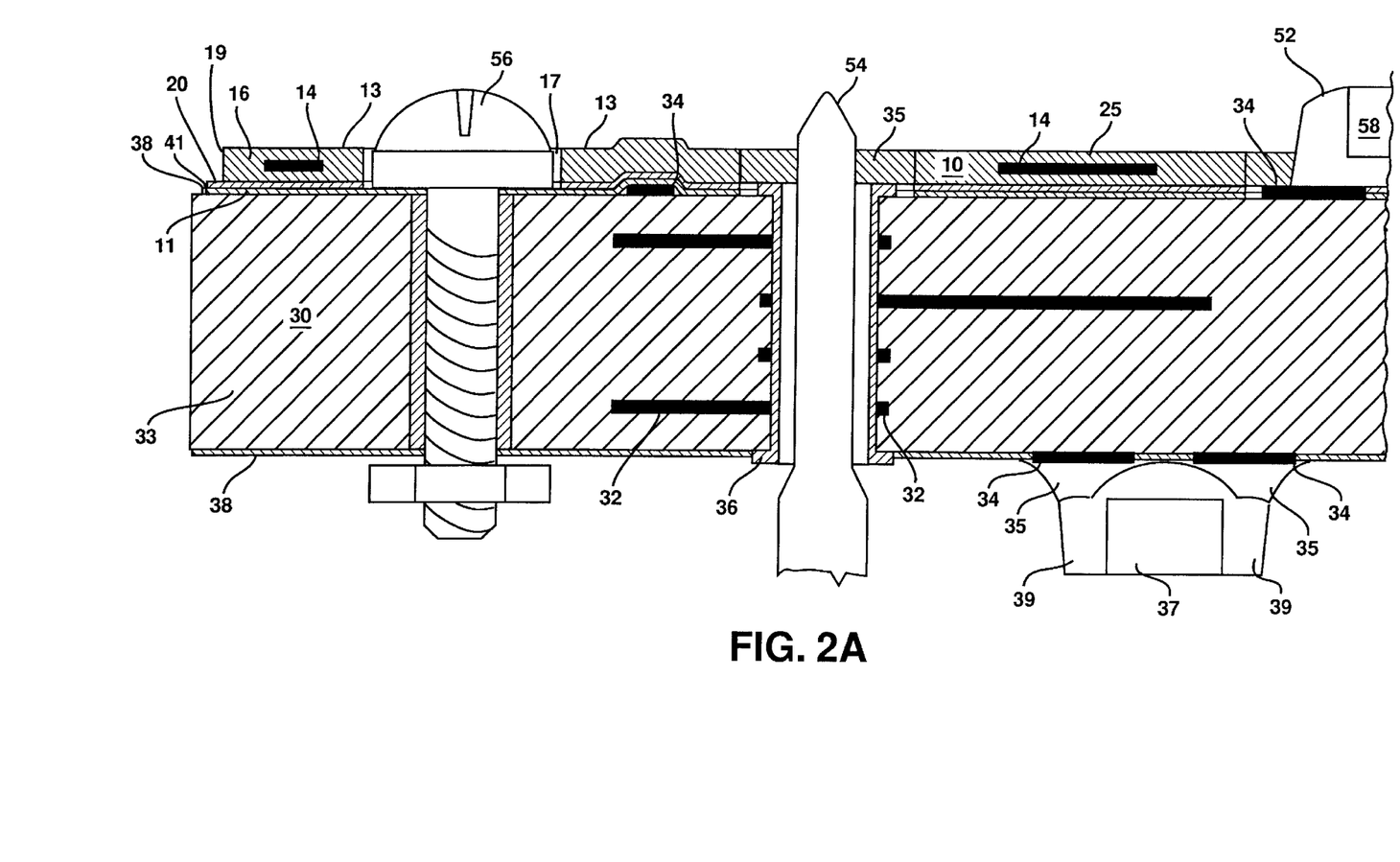
FIGS. 2A–2C are partially-broken, cross-sectional side views further illustrating on an enlarged scale the embodiment of the present invention taken along the line 15—15 in FIG. 1, as utilized with an already modified printed circuit board, whereby the flexible wire patch and circuit components are affixed to the surfaces thereof.
Figure 2B:
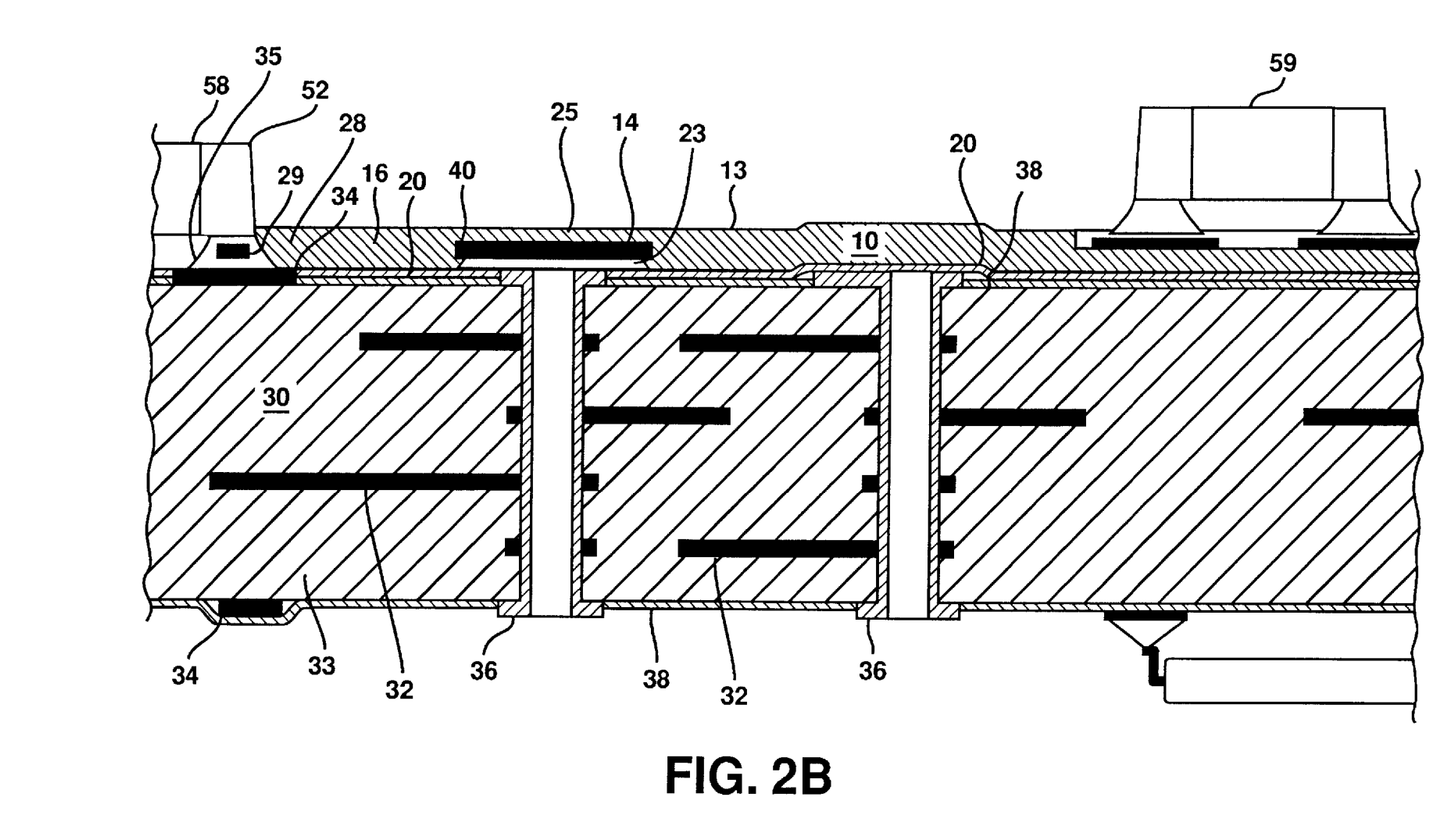
Figure 2C:
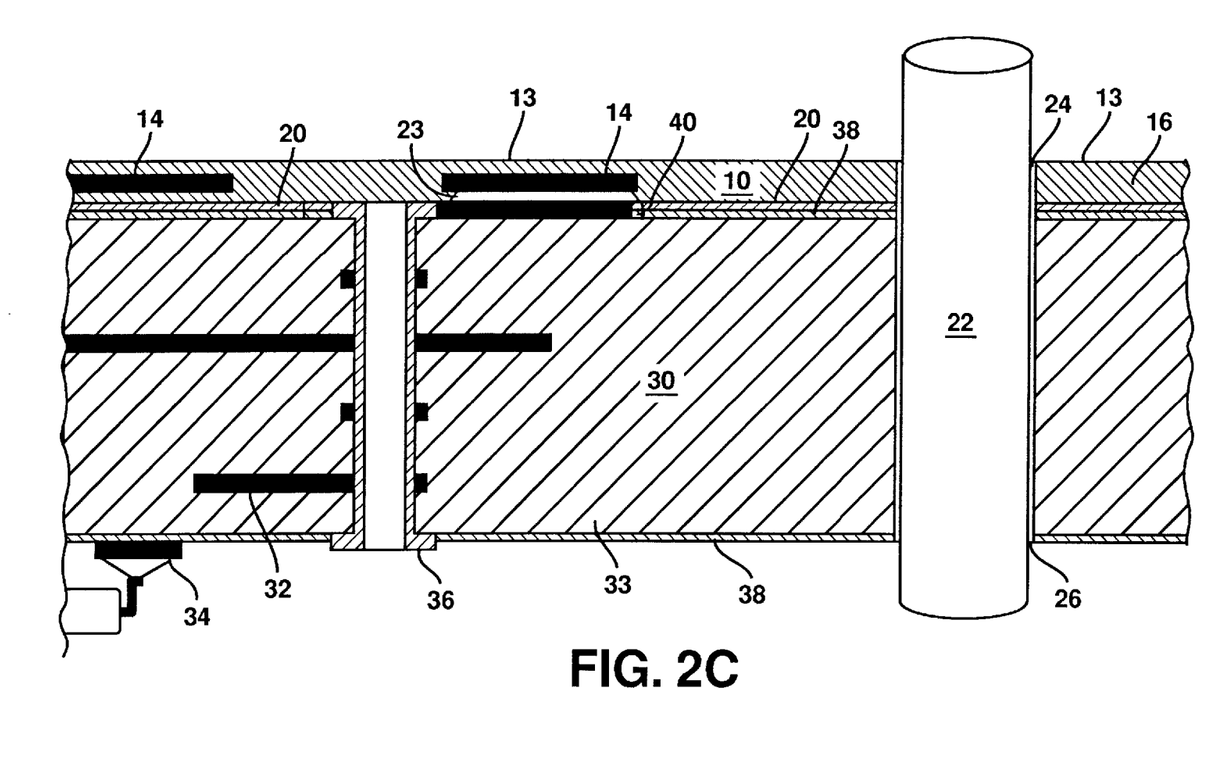

Referring now to FIG. 2, there is shown a cross-sectional view, that spans between FIGS. 2A–2C, of the FWP substrate 10 taken along the line 15—15 in FIG. 1. In FIG. 2, the FWP substrate 10 has been affixed to the rigid substrate of a circuitized PCB substrate 30. The PCB substrate 30 represented in FIG. 2 is shown in its conventional form and configuration, which may be manufactured by a variety of known processes. For the purposes of the present invention, the PCB substrate 30 has been illustrated to include many individual electrical conductors or internal wire traces 32 that form a predetermined circuit pattern and which are separated from one another by supporting and insulating material 33 which is generally epoxy, ceramic or the like. This insulating material 33 forms a relatively thick and rigid PCB substrate 30 that both supports and protects the internal wire traces 32.

The PCB substrate 30 may also contain surface electrical conductors or surface traces 34 for interconnection with electrical components to be mounted thereon. Pre-selected internal traces 32 may be brought into electrical contact with one-another and with surface traces 34 by means of numerous electrical interconnects or vias 36, that are vertically imbedded through the PCB substrate 30. There may also be numerous electrical components located on either surface of the PCB substrate 30, such as resistor 37, which may be brought into electrical connection with one another by means of various combinations of vias 36, internal traces 32 and surface traces 34.

Each of the surface traces 34 may be coated with a thin insulating and protective solder mask layer 38. As illustrated in FIG. 2A, electrical connection between the surface traces 34 and the bonding leads 39 of the electrical component 37 is made possible by creating contact openings in the overlying solder mask layer 38 through which solder 35 may be applied directly to the exposed surface traces 34.

Referring still to FIG. 2, the FWP substrate 10 is shown already attached to the PCB substrate 30. As illustrated, the FWP substrate 10 contains one or more thin electrically conducting wires 14, also forming a pre-determined circuit pattern, each of which wires 14 is sandwiched between layers of thin, flexible, electrically insulating material 16. The wires 14 may be selectively routed to provide desired circuit interconnects with respect to the surface traces 34 of the PCB substrate 30, which routing and interconnects are described in detail below. It should be understood that for FWP substrates which include multiple layers of wires, such wires may be electrically interconnected within the substrate by the use of conductive vias inserted vertically between such layers.

The wires 14 may be comprised of any suitable conductive material such as a thin layer of copper, silver, aluminum or a conductive ink. The pattern of wires 14 may be applied to one or more layers of the insulating material 16 by any suitable means, such as by screen printing or an etching or deposition process. According to the preferred embodiment of the present invention, the wires 14 are approximately one-to-two milli-inches thick. When wires 14 are used as signal carrying leads, they may have a width of from approximately five to fifteen milli-inches. Greater lead widths are recommended for those wires 14 serving as ground and power leads. Each layer of the insulating material 16 of the FWP substrate 10 is composed of approximately one-to-two milli-inch thick layers of a polyimide or epoxy resin material such as Kaptan (a trademark and product of DuPont Chemical). Kaptan has been selected for use in the present invention due to its flexibility, high thermal stability, and dielectric characteristics.

Since a means of fixedly applying the FWP substrate 10 to the PCB substrate 30 is required, preferably, a thin nonconductive adhesive layer 20, such as a thermally curable adhesive sheet, is either applied directly to the lower surface 11 of the FWP substrate 10, prior to attachment, or is positioned between the lower surface 11 of the FWP substrate and the upper surface 41 of the PCB substrate 30, at the time of attachment, in order to firmly bind the FWP substrate 10 to the PCB substrate 30. Naturally, many other means of applying and/or attachment could be utilized, such as solder, heat, screws, etc. Due to the inherent flexibility of the FWP substrate 10, the lower surface 11 of the FWP substrate 10 will readily conform to the contours of the upper surface 41 of the PCB substrate 30. A thermal adhesive sheet may be used to achieve this topographical conformity to surface contours. Such conformation assures that a good mechanical bond between the FWP substrate 10 and the PCB substrate 30 will be attained and maintained. Additionally, due to the close adhesion of the FWP substrate 10 to the PCB substrate 30, the wires 14 may, in the manner to be described below, better provide reliable electrical interconnection between selected surface traces 34.

As illustrated in FIGS. 2B and 2C, lower surface contact voids 23 in the insulating material 16 are selectively situated in the lower surface 11 of the FWP substrate 10 and may be used to selectively expose certain of the wires 14. As shown in FIG. 2C, the wires 14 exposed by means of such contact voids 23 may be brought into electrical contact with the surface traces 34 of the PCB substrate 30 via corresponding contact openings 40 created in and through the solder mask layer 38. As shown in FIG. 2B, vias 36 may also be exposed in this manner for contact with wires 14 and for interconnection to traces 32. When the lower surface contact voids 23 have been positioned in the lower surface 11 of the FWP substrate 10, so as to align with pre-selected contact openings 40 in the solder mask layer 38 of the PCB substrate 30, electrical interconnection between the wires 14 and the surface traces 34 may be made via physical contact (by mechanical compression), solder or other electrically conductive bonding means. By proper circuitization and routing of the wires 14 within the FWP substrate 10, electrical interconnections may be made between patterns of predetermined surface traces 34 so as to enable the electrical bypass of incorrectly wired or defective patterns of internal traces 32 and/or surface traces 34 of the PCB substrate 30.

As illustrated in FIGS. 2A and 2B, upper surface contact voids 25 may be selectively situated in the upper surface 13 of the FWP substrate 10, thereby exposing the wires 14 situated therein. Such upper surface contact voids 25 may be used to confirm that the correct electrical connections have been made between the wires 14, the desired surface traces 34 and, as particularly illustrated in FIG. 2B, vias 36. After the FWP substrate 10 has been affixed to the PCB substrate 30, an electrical probe may be used at voids 25, according to common electrical testing techniques, to confirm the integrity of the otherwise inaccessible electrical circuitry created by the wires 14. Such electrical tests may detect possible opens, shorts or miswiring between the wires 14 within the FWP substrate 10 and the desired surface traces 34 of the PCB substrate 30.

As further illustrated in FIG. 2A, clearance holes 17 may be cut into and through the FWP substrate 10 so as to permit any topographically significant features contained on or components mounted to the upper surface 41 of the PCB substrate 30 to pass therethrough. Such clearance holes 17 would be particularly appropriate with respect to any topographical features that may extend above the upper surface 41 of the PCB substrate 30 by more than the height of the FWP substrate 10. Preferably, the clearance holes 17 will be of the same planar shape but slightly larger dimensions than the cross-sectional footprint dimensions of the protruding feature or component passing therethrough. In FIG. 2A, objects, such as the large component lead 54 and the screw 56, can be seen to pass through the FWP substrate 10 by means of such clearance holes 17.

Clearance holes 17 may also be employed to allow access to preselected areas on the upper surface 41 of the PCB substrate 30 through the FWP substrate 10. Such clearance holes 17 may be used to allow the soldering of electrical components directly onto the surface traces 34 of the PCB substrate 30 or for visual and/or electrical inspection of portions of the upper surface 41 of the PCB substrate 30 the after the FWP substrate 10 has been permanently attached thereto. For maximum effectiveness, such clearance holes 17 may be of a size and shape slightly larger than the size and shape of the underlying points of desired soldering or inspection. For example, in FIG. 2A, the clearance hole 17, positioned to allow the passage of the large component lead 54, also serves to enable the solder bonding of that component lead 54 to the PCB substrate 30. The solder 35 applied during the soldering of the component lead 54 to the PCB substrate 30 is typically accomplished by a wave soldering technique and, according to the present invention, this wave soldering technique may be applied to the PCB substrate 30 after the FWP substrate 10 has been permanently affixed thereto.

As further illustrated in FIG. 2B, according to the present invention upper surface contact voids may be positioned so as to combine with similarly formed and aligned lower surface contact voids so as create a component mounting opening 28 which exposes component solder bonding wires 29. Such solder bonding wires 29 are, by means of the voids or openings 28, exposed for electrical contact from the direction of both the upper and lower surfaces 11 and 13 of the FWP substrate 10. As shown in FIG. 2B, the solder bonding wires 29 may be brought into simultaneous electrical contact with pre-selected surface traces 34 on the PCB substrate 30 and the conductive contacts or bonding leads 52 of an electrical component 58. Once the FWP substrate 10 has been affixed to the PCB substrate 30, electrical components such as the electrical component 58 can be soldered to and mounted directly onto the PCB substrate 30 at these mounting sites while simultaneously being made to be in electrical contact by solder 35 with the desired wires 14 within the FWP substrate 10. By this means, numerous electrical components may be simultaneously made to be in electrical contact with both wires 14 within the FWP substrate 10 and surface traces 34 which are designed to serve as bonding pads on the PCB substrate 30.

To properly affix the FWP substrate 10 to the PCB substrate 30, the FWP substrate 10 must be correctly aligned with the upper surface 41 of the PCB substrate 30. Such alignment may be achieved by the use of either mechanical alignment means or optical alignment means. As illustrated in FIG. 2C, for mechanical alignment, two or more FWP alignment holes 24 may cut into and through the FWP substrate 10. Such FWP alignment holes 24 are positioned to be in coaxial alignment with similarly positioned PCB alignment holes 26, which are of substantially identical shape and dimensions. Appropriately sized and shaped pegs or dowels 22 may be mechanically inserted simultaneously through both alignment holes 24 and 26, respectively, thereby mechanically forcing the proper alignment of the FWP substrate 10 and the PCB substrate 30 prior to permanent attachment thereto. Although not illustrated, optical alignment may be achieved by well known techniques incorporating one or more metallic or optically opaque cross hairs or other images in or on the upper surface 11 of the FWP substrate 10 such that an optical sensing and placing machine may be employed to align such cross hairs with respect to similar associated marks on the upper surface 41 of the PCB substrate 30. Proper alignment of the FWP substrate 10 with selectively positioned optical or mechanical cues incorporated into or on the PCB substrate 30 can be achieved by various means common to the industry.

Turning again to FIG. 1, as illustrated, a proper radius may be applied to the corners 27 of the FWP substrate 10 to reduce the tendency inherent in sharp rectangular edges to delaminate from the PCB substrate 30. As further illustrated in FIG. 2A, in the preferred embodiment of the invention, each of the wires 14 may be buffered from the horizontal edges 19 of the FWP substrate 10. This buffer is preferably a distance equal to approximately ten to twenty-five milli-inches. This buffer serves to help insure that the wires 14 are properly protected against shorts or opens that might result from post-application abrasion of the horizontal edges 19 of the FWP substrate 10.

Figure 3:
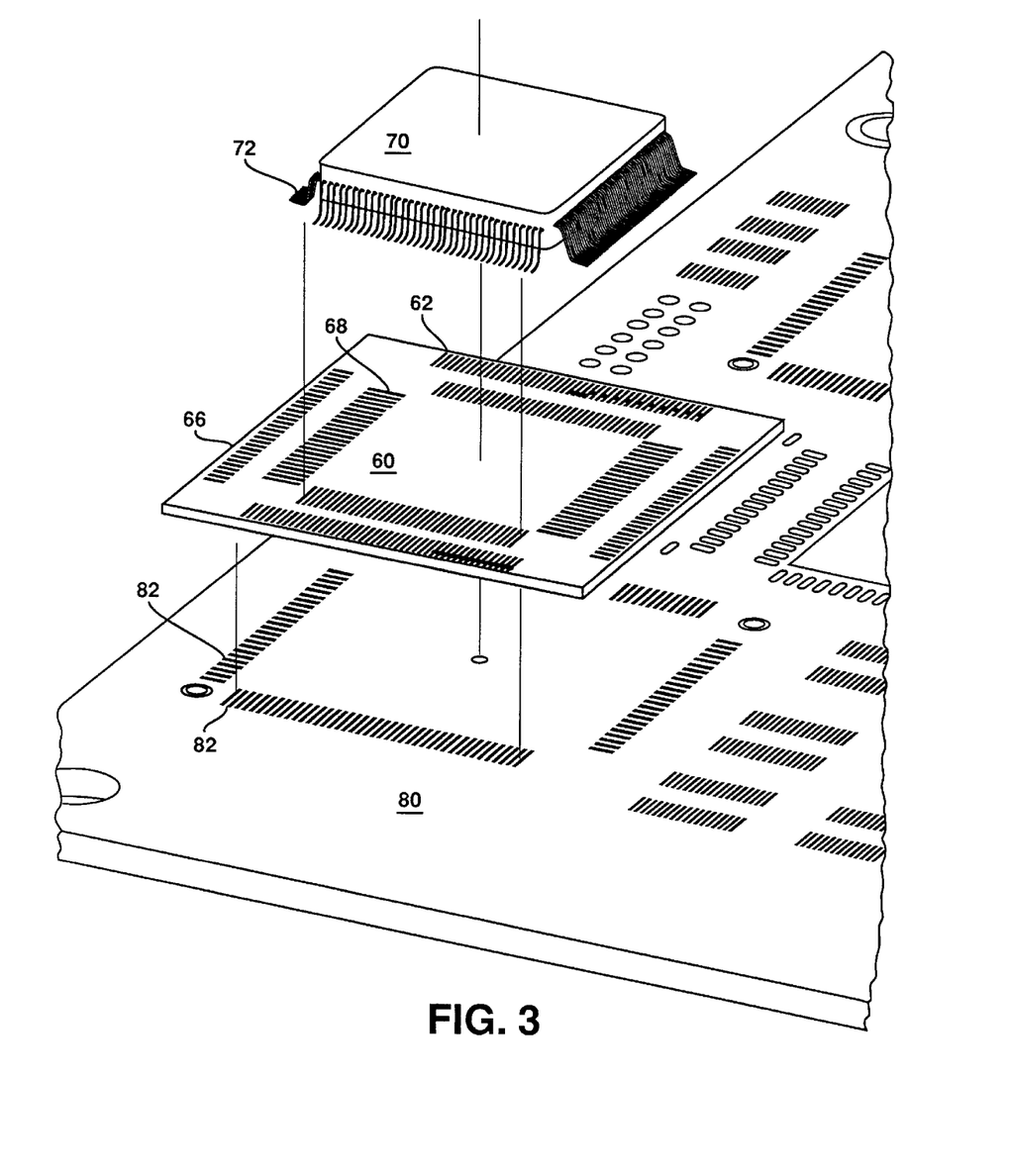
FIG. 3 is a partially-broken, exploded perspective view of an alternative embodiment of the present invention, as utilized with an integrated circuit component and a printed circuit board.
Figure 4:
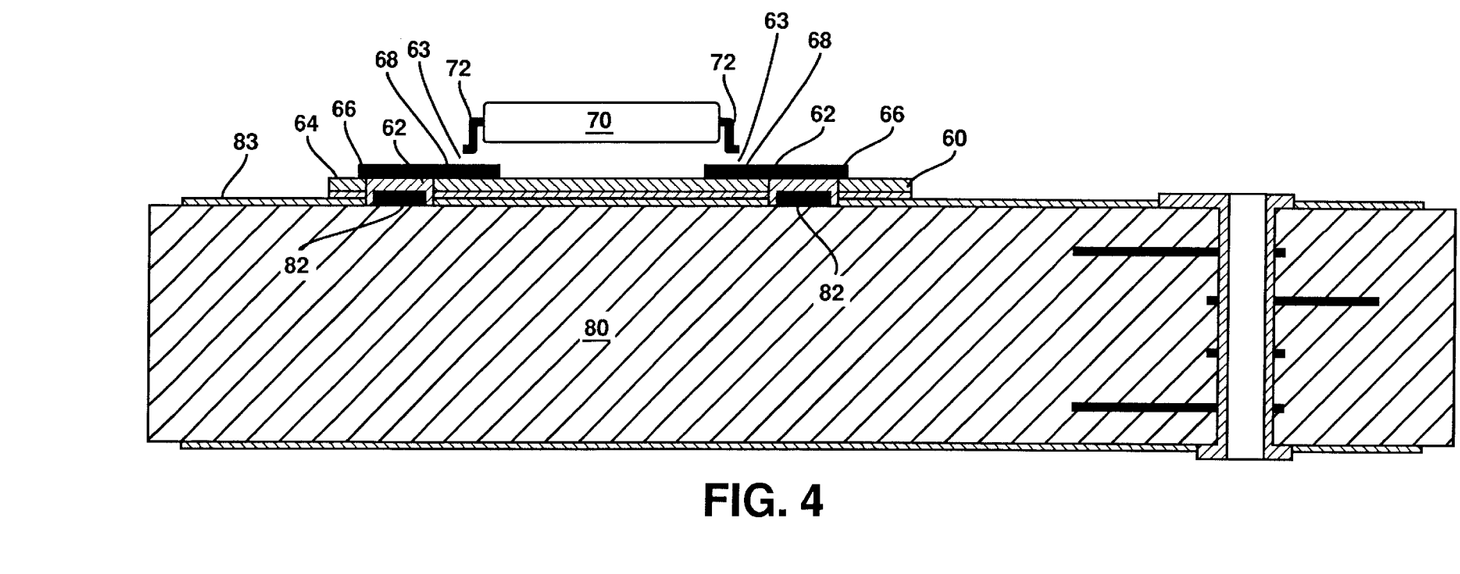
FIG. 4 is a partially-broken, cross-sectional side view further illustrating on an enlarged scale the alternative embodiment of the present invention illustrated in FIG. 3, as utilized with an already modified printed circuit board, whereby the flexible wire patch and a circuit component are affixed to a surface thereof.

Turning now to the exploded perspective illustration of FIG. 3, there is shown an alternate embodiment of the present invention wherein the flexible wire bonding patch has been specifically designed to serve as the physical and electrical connecting interface patch 60 between a multi-lead circuit component 70 and the designated bonding-pad surface traces 82 of a printed circuit board 80. As illustrated in the partially-broken, cross-sectional side view provided in FIG. 4, the surface traces 82 have been exposed for electrical connection to the interface patch 60 by selective removal of portions of the solder mask layer 83 of the printed circuit board 80. As illustrated in FIGS. 3 and 4, in this embodiment of the invention, the interface patch 60 contains electrically conductive wires 62 that are deposited on or sandwiched between one or more thin layers of flexible, electrically insulating material 64. The wires 62 are patterned in such a manner that the outer set of lead ends 66 of such wires 62 exactly match the layout of the surface traces 82. The surface traces 82 have been designed to serve as bonding-pad footprint contacts for a component of a larger bonding pad footprint size than that of the circuit component 70, as illustrated in FIGS. 3 and 4. Within the interface patch 60, the layout spacing and dimensions of the corresponding inner set of lead ends 68 of the wires 62 exactly match the set of bonding pad footprint leads 72 of the circuit component 70. The inner set of lead ends 68 have been exposed for electrical and/or mechanical engagement with the footprint leads 72 of the circuit component 70 by either leaving the wires 62 exposed or by the selective removal of insulating material 64 from the interface patch 60 and the application of solder 63. Interface patch 60 has been designed to enable the attachment to the printed circuit board 80 of a circuit component 70 that has smaller bonding lead footprint dimensions than the bonding-pad footprint dimensions of the component originally designed for attachment to the printed circuit board 80.

As an additional feature of the interface patch 60 into the circuitry illustrated in FIGS. 3 and 4, the wire spacing or pitch between each of the inner lead ends 68 of the interface patch 60 can be made to be much finer and/or narrower than the spacing or pitch that might be economically or feasibly manufactured for the bonding-pad surface traces 82 of the printed circuit board 80. By the use of a properly designed interface patch 60, such as that illustrated in FIGS. 3 and 4, the manufacturer of printed circuit board 80 may be able to avoid yield losses and the resulting extra expense inherent in attempting to place fine pitched bonding-pad leads on the surface of the printed circuit board 80. The use of an interface patch 60 would be particularly appropriate in instances where a fine lead pitch may be dictated in order to affix modern, fine-pitched, multi-lead, surface mounted circuit components to the printed circuit board 80.

Figure 5:
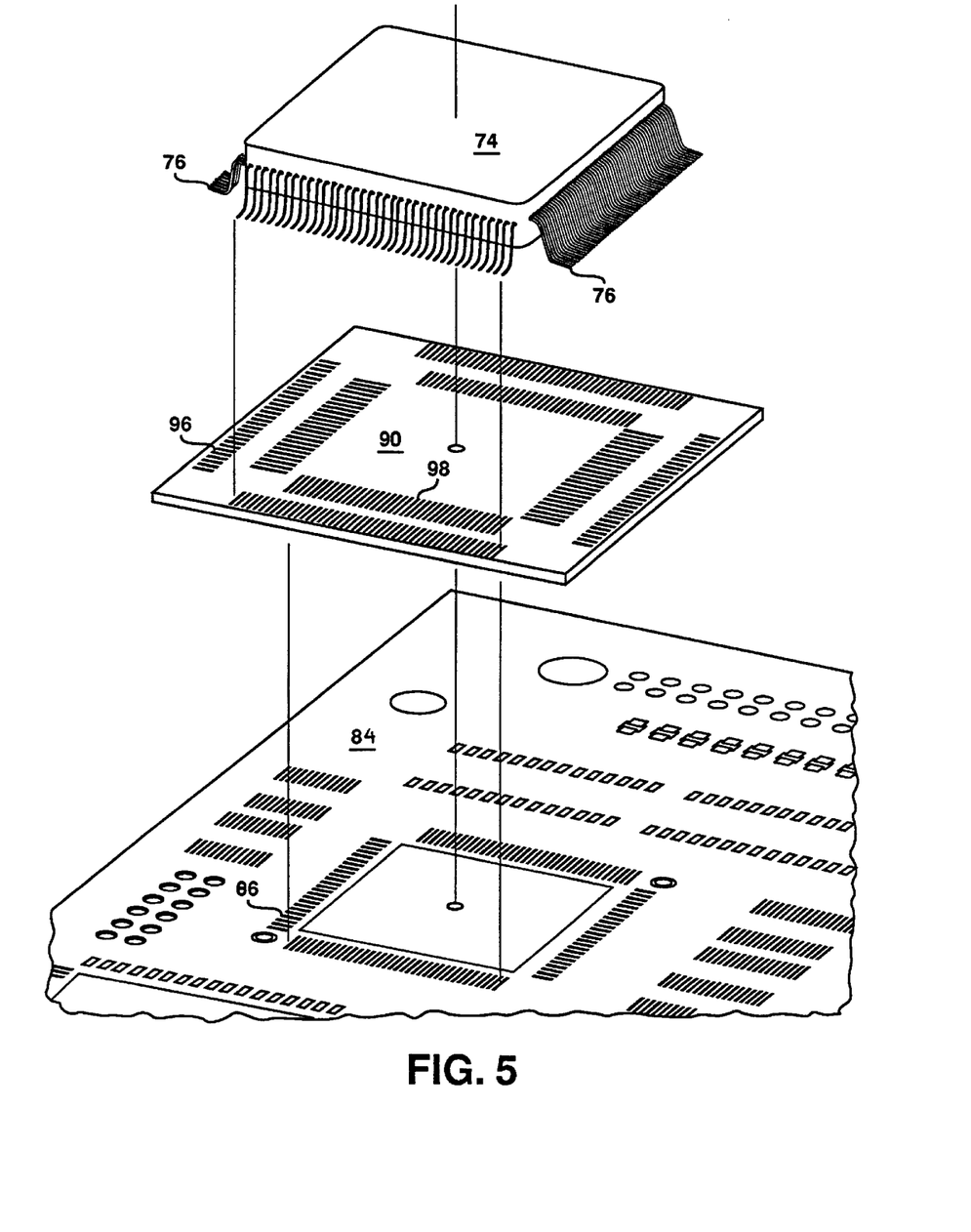
FIG. 5 is a partially-broken, exploded perspective view of an alternative embodiment of the present invention, as utilized with an integrated circuit component and a printed circuit board.
Figure 6:
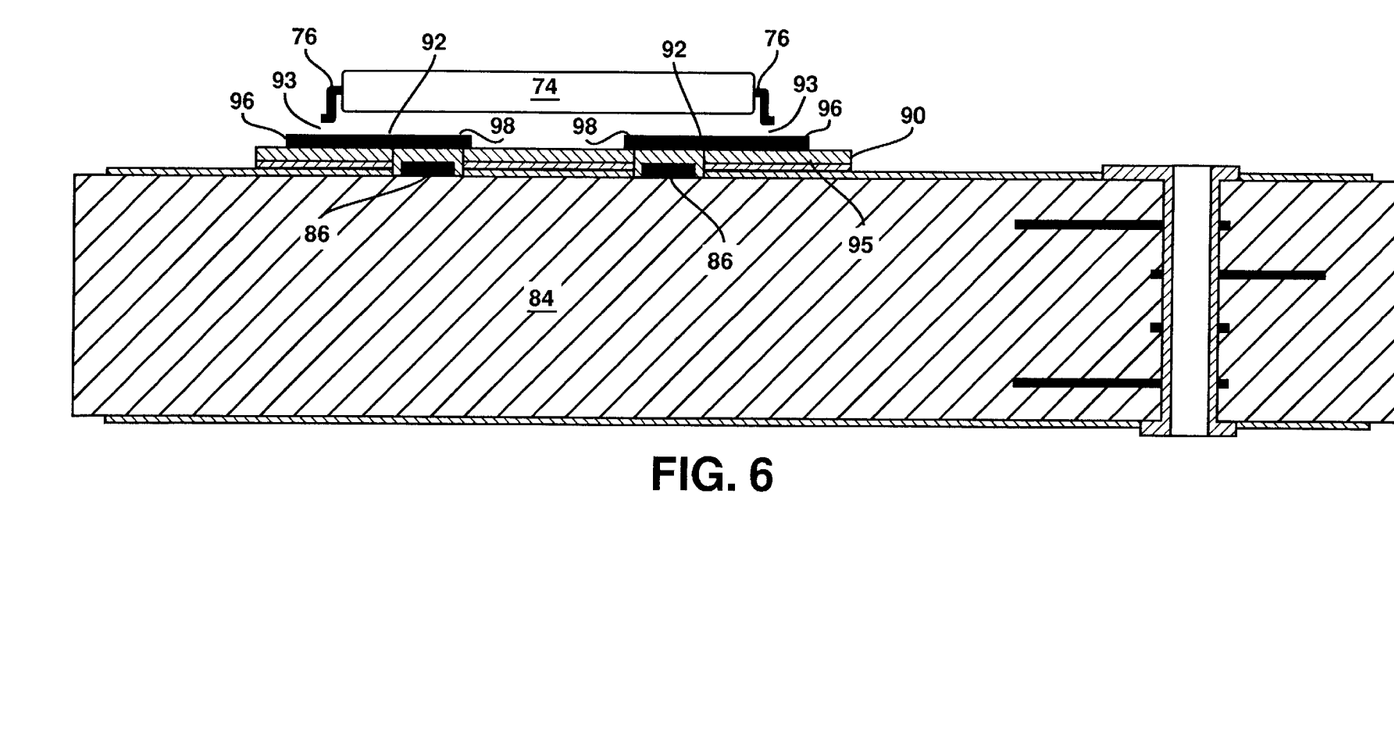
FIG. 6 is a partially-broken, cross-sectional side view further illustrating on an enlarged scale the alternative embodiment of the present invention illustrated in FIG. 5, as utilized with an already modified printed circuit board, whereby the flexible wire patch and a circuit component are affixed to a surface thereof.

In FIGS. 5 and 6, a second version of the alternative embodiment of the present invention is illustrated, wherein the bonding-pad footprint dimensions of a multi-lead circuit component 74 are smaller than the bonding-pad footprint dimensions of the bonding-pad surface traces 86 originally designed for attachment to the printed circuit board 84. In the cross-sectional side view illustrated in FIG. 6, it can be seen that the electrically conductive wires 92 of the flexible wire bonding interface patch 90 are designed and laid out in such a manner that the inner set of lead ends 98 of such wires 92 exactly match the layout of the surface traces 86 on the printed circuit board 80. The surface traces 86 have been designed to serve as bonding-pad footprint contacts for a component of larger bonding-pad footprint than that of the circuit component 74. The corresponding outer set of lead ends 96 of the wires 92 exactly match the set of bonding-pad footprint leads 76 of the circuit component 74. The outer set of lead ends 96 have been exposed for electrical and/or mechanical engagement with the footprint leads 76 of the circuit component 74 by either leaving the wires 92 exposed or by the selective removal of insulating material 95 from the interface patch 90 and the application of solder 93. Interface patch 90 has been designed to enable the attachment to the printed circuit board 84 of a circuit component 74 that has larger bonding-pad lead footprint dimensions than the bonding-pad footprint dimensions of the component originally designed for attachment to the printed circuit board 84.

While the present invention has been described in connection with the preferred and alternative embodiments of the various figures, it is to be understood that other similar embodiments may be used and modifications and additions may be made to the described embodiments for performing the same function of the present invention without deviating therefrom. For example each of the flexible wire patches and flexible wire bonding patches have been described with a single layer of electrical wiring whereas multiple layers of electrical wire are feasible and may be required due to wire interconnect capacity requirements. Therefore, the present invention should not be limited to any single embodiment, but rather construed in breadth and scope in accordance with the recitation of the appended claims.

I claim:

1. An electrical arrangement comprising:
   a first circuitized substrate having at least two substantially planar surfaces including a plurality of electrical conductors located on at least one of said surfaces in a first pre-determined pattern:
   a second circuitized substrate having at least two substantially planar surfaces, said second substrate further having
     (i) a flexible wiring layer formed from a second pre-determined pattern of electrically conductive wires, said wires being adapted to connect to respective ones of said electrical conductors of said first substrate, and
     (ii) surface layers configured above and below said wiring layer, said surface layers being formed from a flexible, electrically insulating dielectric material;
   a means for fixedly applying one surface of said second substrate to one surface of said first substrate; and
   a means for connecting said wires of said second substrate to said electrical conductors of said first substrate, whereby application of said second substrate to said first substrate and connection of said wires of said second substrate to said electrical conductors of said first substrate modifies said first pre-determined pattern to include said second pre-determined pattern.

2. The electrical arrangement according to claim 1, wherein said first substrate is a printed circuit board.

3. The electrical arrangement according to claim 1, wherein said second substrate is a flexible wire patch.

4. The electrical arrangement according to claim 1, wherein said surface layers of said second substrate are substantially one to two milli-inches thick.

5. The electrical arrangement according to claim 1, wherein said wiring layer of said second substrate is composed of an electrically conductive metal.

6. The electrical arrangement according to claim 5, wherein said conductive metal is substantially one to two milli-inches thick.

7. The electrical arrangement according to claim 1, wherein said wires are positioned within said wiring layer in such a manner that a buffer is created between said wires and an outer edge of the second substrate.

8. The electrical arrangement according to claim 1, wherein said second substrate includes a plurality of wiring layers separated by at least one flexible electrically insulating dielectric layer, each of said wiring layers being formed from pre-determined patterns of electrically conductive wires that are pre-selectedly brought into electrical contact with each other by means of electrically conductive vias.

9. The electrical arrangement according to claim 1, wherein each of said electrical components is arranged at a component mounting site, said site including a plurality of lead pads for corresponding connection to conductive elements on said electrical component.

10. A flexible wiring patch, comprising:
    a first circuitized substrate having at least two substantially planar surfaces, including
      (i) a flexible wiring layer formed from a first pre-determined pattern of electrically conductive wires, and
      (ii) surface layers configured above and below said wiring layer, said surface layers being formed from a flexible, electrically insulating dielectric material, said first substrate being operative to be applied to a surface of a second circuitized substrate including a plurality of electrical conductors forming a second predetermined pattern, whereby application of said first substrate to said second substrate and connection of said wires to said electrical conductors modifies said second pre-determined pattern to include said first pre-determined pattern.

11. An electrical arrangement comprising:
    a first circuitized substrate having at least two substantially planar surfaces including a plurality of electrical conductors located on at least one of said surfaces in a first predetermined pattern:
    a second circuitized substrate having at least two substantially planar surfaces, said second substrate further having
      (i) a flexible wiring layer formed from a second pre-determined pattern of electrically conductive wires, said wires being adapted to connect to respective ones of said electrical conductors of said first substrate, and
      (ii) surface layers configured above and below said wiring layer, said surface layers being formed from a flexible, electrically insulating dielectric material, wherein a surface layer of said second substrate forms a plurality of pre-determined voids, at least one of said voids being operative to expose pre-selected ones of said wires;
    a means for fixedly applying one surface of said second substrate to one surface of said first substrate; and
    means for connecting said wires of said second substrate to said first substrate, whereby application of said second substrate to said first substrate and connection of said wires of said second substrate to said electrical conductors of said first substrate modifies said first predetermined pattern to include said second pre-determined pattern.

12. The electrical arrangement according to claim 11, wherein an opposing surface layer of said second substrate forms a plurality of predetermined voids, at least one of said voids being operative to expose preselected ones of said wires, and wherein at least one of said voids in said surface layer is axially aligned to correspond with at least one of said voids in said opposing surface layer so as to form aligned voids.

13. The electrical arrangement according to claim 12, further comprising one or more electrical components having conductive elements for connection to at least one lead pad formed from said electrical conductors, wherein preselected ones of said aligned voids expose predetermined ones of said wires so as to allow for mechanical and electrical contact between said wires and said lead pad, and so as to allow for mechanical and electrical contact between said wires and said conductive elements.

14. The electrical arrangement according to claim 11, further comprising an electrical component having conductive elements for connection to at least one lead pad formed from said electrical conductors, wherein preselected ones of said voids of said surface layer expose predetermined ones of said wires so as to allow for mechanical and electrical contact between an exposed wire and at least one conductive element on said electrical component.

15. The electrical arrangement according to claim 12, further comprising an electrical component having conductive elements for connection to at least one lead pad formed from said electrical conductors, wherein preselected ones of said voids of said surface layer expose predetermined ones of said wires so as to allow for mechanical and electrical contact between an exposed wire and one or more conductive elements on said electrical component, and wherein preselected ones of said voids of said opposing surface layer further expose said exposed wire so as to allow for mechanical and electrical contact between said exposed wire and at least one lead pad whereby conductive elements of said electrical component are electrically connected to lead pads of said first substrate.

16. An electrical arrangement comprising:
a first circuitized substrate having at least two substantially planar surfaces including a plurality of first electrical conductors located on at least one of said surfaces in a first pre-determined pattern;
a second substrate having at least two substantially planar surfaces, said second substrate further having:
  (i) a flexible connection layer formed from a second pre-determined pattern of second electrical conductors, said second electrical conductors being adapted to connect to respective ones of said first electrical conductors of said first substrate, and
  (ii) surface layers configured above and below said flexible connection layer, said surface layers being formed from a flexible, electrically insulating material, and wherein a surface layer of said second substrate forms a plurality of pre-determined voids, at least one of said voids being operative to expose a pre-selected one of said second electrical conductors, and wherein an opposing surface layer of said second substrate forms a plurality of predetermined voids, at least one of said voids being operative to expose said preselected one of said second electrical conductors;
a means for fixedly applying one surface of said second substrate to one surface of said first substrate; and
a means for connecting of said second electrical conductors of said second substrate to said first electrical conductors of said first substrate, whereby application of said second substrate to said first substrate and connection of said second electrical conductors of said second substrate to said electrical conductors of said first substrate modifies said first pre-determined pattern to include said second pre-determined pattern.

17. The electrical arrangement according to claim 16, further comprising at least one electrical component having conductive elements for connection to at least one lead pad formed from at least one of said first electrical conductors, wherein preselected ones of said aligned voids expose predetermined ones of said second electrical conductors so as to allow for mechanical and electrical contact between said second electrical conductors and said lead pads, and so as to allow for mechanical and electrical contact between said second electrical conductors and said conductive elements.

18. The electrical arrangement of claim 16, further comprising at least one electrical component having conductive elements for connection to a lead pad formed from at least one of said second electrical conductors, wherein preselected ones of said aligned voids expose predetermined ones of said second electrical conductors so as to allow for mechanical and electrical contact between said second electrical conductors and a lead pad formed from at least one of said first electrical conductors, and so as to allow for mechanical and electrical contact between said second electrical conductors and said conductive elements.

19. The electrical arrangement of claim 18, wherein said lead pad on said second substrate is a smaller footprint size than said lead pad on said first substrate.

20. The electrical arrangement of claim 19, wherein said lead pad on said second substrate is a larger footprint size than said lead pad on said first substrate.

21. An electrical arrangement comprising:
a first circuitized substrate having at least two substantially planar surfaces including a plurality of first electrical conductors located on at least one of said surfaces in a first pre-determined pattern;
a second substrate having at least two substantially planar surfaces, said second substrate further having:
  (i) a flexible connection layer formed from a second pre-determined pattern of second electrical conductors said second electrical conductors being adapted to connect to respective ones of said first electrical conductors of said first substrate, and
  (ii) surface layers configured above and below said flexible connection layer, said surface layers being formed from a flexible, electrically insulating material, and wherein a surface layer of said second substrate forms a plurality of pre-determined voids, at least one of said voids being operative to expose pre-selected ones of said second electrical conductors, and
an electrical component having conductive elements for connection to at least one lead pad formed from at least one of said first electrical conductors, wherein preselected ones of said voids of said surface layer expose predetermined ones of said second electrical conductors so as to allow for mechanical and electrical contact between an exposed second electrical conductor and at least one conductive element on said electrical component;
a means for fixedly applying one surface of said second substrate to one surface of said first substrate; and
means for connecting said second electrical conductors of said second substrate to said first substrate, whereby application of said second substrate to said first substrate and connection of said second electrical conductors of said second substrate to said first electrical conductors of said first substrate modifies said first pre-determined pattern to include said second predetermined pattern.

* * * * *